United States Patent
Abraham et al.

(10) Patent No.: US 9,253,904 B2
(45) Date of Patent: Feb. 2, 2016

(54) PROTECTIVE LOCKING MECHANISM FOR DEVICE ENCLOSURE

(71) Applicant: Apple Inc., Cupertino, CA (US)

(72) Inventors: Euan Abraham, Sunnyvale, CA (US); George Marc Simmel, Cupertino, CA (US); Joshua Funamura, San Jose, CA (US); Danny McBroom, Leonard, TX (US)

(73) Assignee: Apple Inc., Cupertino, CA (US)

( * ) Notice: Subject to any disclaimer, the term of this patent is extended or adjusted under 35 U.S.C. 154(b) by 637 days.

(21) Appl. No.: 13/657,839

(22) Filed: Oct. 22, 2012

(65) Prior Publication Data

US 2014/0111922 A1    Apr. 24, 2014

(51) Int. Cl.
G06F 1/16 (2006.01)
H05K 7/16 (2006.01)
H01R 13/62 (2006.01)
H05K 5/02 (2006.01)
G06F 1/18 (2006.01)
H05K 7/00 (2006.01)
H05K 5/00 (2006.01)
H01R 13/447 (2006.01)

(52) U.S. Cl.
CPC .............. *H05K 5/0221* (2013.01); *G06F 1/16* (2013.01); *G06F 1/181* (2013.01); *G06F 1/182* (2013.01); *G06F 1/189* (2013.01); *H01R 13/447* (2013.01); *H05K 5/00* (2013.01); *H05K 7/00* (2013.01)

(58) Field of Classification Search
CPC . E05B 73/0017; E05B 73/0082; G06F 1/181; G06F 1/189; G06F 1/182; G06F 1/16; H05K 5/00; H05K 5/0221; H05K 7/00; H01R 13/447

USPC ............ 361/679.57, 679.32, 679.01–679.45, 361/679.55–679.59, 724–727; 70/58, 63, 70/78; 439/304; 174/66, 67
See application file for complete search history.

(56) References Cited

U.S. PATENT DOCUMENTS

| | | | | |
|---|---|---|---|---|
| 6,130,822 A * | 10/2000 | Della Fiora | ............ | G06F 1/181 16/254 |
| 6,836,405 B2 * | 12/2004 | Alfonso | ................ | G06F 1/181 292/165 |
| 6,970,351 B2 * | 11/2005 | Perez | ...................... | G06F 1/181 312/223.2 |
| 7,443,661 B2 * | 10/2008 | Xu | ......................... | G06F 1/182 312/223.2 |
| 8,081,451 B1 * | 12/2011 | Chen | ..................... | G06F 1/181 361/679.45 |
| 8,254,117 B2 * | 8/2012 | Tang | ....................... | G06F 1/181 248/551 |
| 8,922,993 B2 * | 12/2014 | Seibert | ............... | H05K 5/0217 361/679.57 |
| 2005/0039502 A1 * | 2/2005 | Avganim | ............... | G06F 21/32 70/58 |

(Continued)

*Primary Examiner* — Nidhi Thaker
(74) *Attorney, Agent, or Firm* — Kilpatrick Townsend & Stockton LLP (57) ABSTRACT

Mechanisms to prevent access to electronic components in an electronic device when the electronic device is receiving power. On example may provide an electronic device including a receptacle, the receptacle including a button. The button may be configured to be depressed by a user, and otherwise to be in a normal state. When the button is depressed, it may act through a locking mechanism to unlock, open, or eject a door covering one or more sockets or electronic components. When the door is closed, the locking mechanism may either prevent the door from being opened, or may maintain the door in a closed state, unless the button is depressed. When a power plug is inserted in the receptacle, the power plug may prevent access to the button. Accordingly, when the power plug is inserted, the button may not be accessible to be depressed, and the door may remain closed.

24 Claims, 6 Drawing Sheets

(56) References Cited

U.S. PATENT DOCUMENTS

| | | | |
|---|---|---|---|
| 2005/0207108 A1* | 9/2005 | Chen | G06F 1/181 361/679.38 |
| 2011/0155447 A1* | 6/2011 | Nihashi | G06F 1/181 174/520 |
| 2012/0092841 A1* | 4/2012 | Sun | 361/759 |
| 2012/0194991 A1* | 8/2012 | Zhang et al. | 361/679.32 |

* cited by examiner

PROTECTIVE LOCKING MECHANISM FOR DEVICE ENCLOSURE

BACKGROUND

Electronic devices have become ubiquitous the past several years. The number and types of portable computing devices, tablet, desktop, and all-in-one computers, cell, smart, and media phones, storage devices, portable media players, navigation systems, monitors and other devices has increased tremendously, and this increase shows no signs of abating.

These electronic devices may include one or more sockets and electronic components. It may be useful to provide users access to some of these sockets and electronic components. For example, it may be useful to provide access such that users may replace failed components. It may also be useful to provide access such that users may upgrade or otherwise improve existing components.

Access to these devices may be provided through components in a device enclosure, such as through doors, slots, removable covers, or other such structure. That is, a door, cover, or other such covering mechanism may be opened or removed to allow access.

Unfortunately, when these components are accessed, they may be damaged. For example, static electricity from a user may damage electrical components when they are being accessed. More importantly, users may be injured, particularly when power is being applied to the electrical components. That is, inadvertent contact between a user accessing internal electrical components of an electronic device may cause injury to the user.

To avoid this user injury, it may be desirable to prevent users from making such inadvertent contact with components that are receiving power. One way to accomplish this may be to prevent access to such components while the electronic device is being powered.

Thus, what is needed are mechanisms for electronic devices and device enclosures to prevent access by a user to electronic components in an electronic device when the electronic device is receiving power.

SUMMARY

Accordingly, embodiments of the present invention may provide mechanisms for electronic devices and device enclosures to prevent access by a user to electronic components in an electronic device when the electronic device is receiving power.

An illustrative embodiment of the present invention may provide an electronic device including a receptacle, the receptacle including a button. The button may be configured to be depressed by a user, and otherwise to be in a normal state. When the button is depressed, it may act through a locking mechanism to either eject or unlock a door, slot, removable cover, or other such structure covering one or more sockets or electronic components. When the door is closed, the locking mechanism may prevent the door from being opened or removed unless the button is depressed. When a power plug is inserted in the receptacle, the power plug may prevent access to the button. Accordingly, when the power plug is inserted, the button may not be accessible to be depressed, and the locking mechanism may prevent the door from being opened or removed. This may prevent a user from accessing electrical components below the door when power is applied to the electronic device.

In various embodiments of the present invention, the receptacle may be a power receptacle. In other embodiments of the present invention, the receptacle may be a receptacle that conveys power and data or other signals. In still other embodiments of the present invention, the receptacle may be another type of receptacle. In various embodiments of the present invention, the door, when opened, may allow access to a socket, electronic components, or other components. In various embodiments of the present invention, the door may cover a socket for memory cards. In this way, when power is removed from the device, the door may be opened to allow access to the socket and cards located therein. When power is applied, the door may not be opened and the socket and cards located therein may not be accessed by a user, thereby protecting possibly both the devices and user.

An illustrative embodiment of the present invention may provide an electronic device. This electronic device may include a receptacle to receive an external electrical connection, the receptacle including a button, the button having a depressed state and a normal state, a door to cover one or more electrical components in the electronic device, the door having an open state and a closed state, and a locking mechanism having a locked state when the button is in the normal state and an open or eject state when the button is in the depressed state.

An illustrative embodiment of the present invention may provide an enclosure for an electronic device. The enclosure may provide a power receptacle to receive a power plug, the power receptacle including prongs for receiving power and a button. The button may be depressed, and when the button is not depressed, the button may return to a normal state. For example, a replacement or closing of a door may drive the button back to the normal state. The enclosure may further include a door to cover a socket for one or more electronic components, the door capable of being open or closed, and a locking mechanism to lock the door, or to not open or eject the door, when the door is closed and the button is in the normal state.

Embodiments of the present invention may provide these features for various types of devices, such as portable computing devices, tablets, desktop computers, laptops, all-in-one computers, cell phone, smart phones, media phones, storage devices, portable media players, navigation systems, monitors and other devices.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Figure 1:
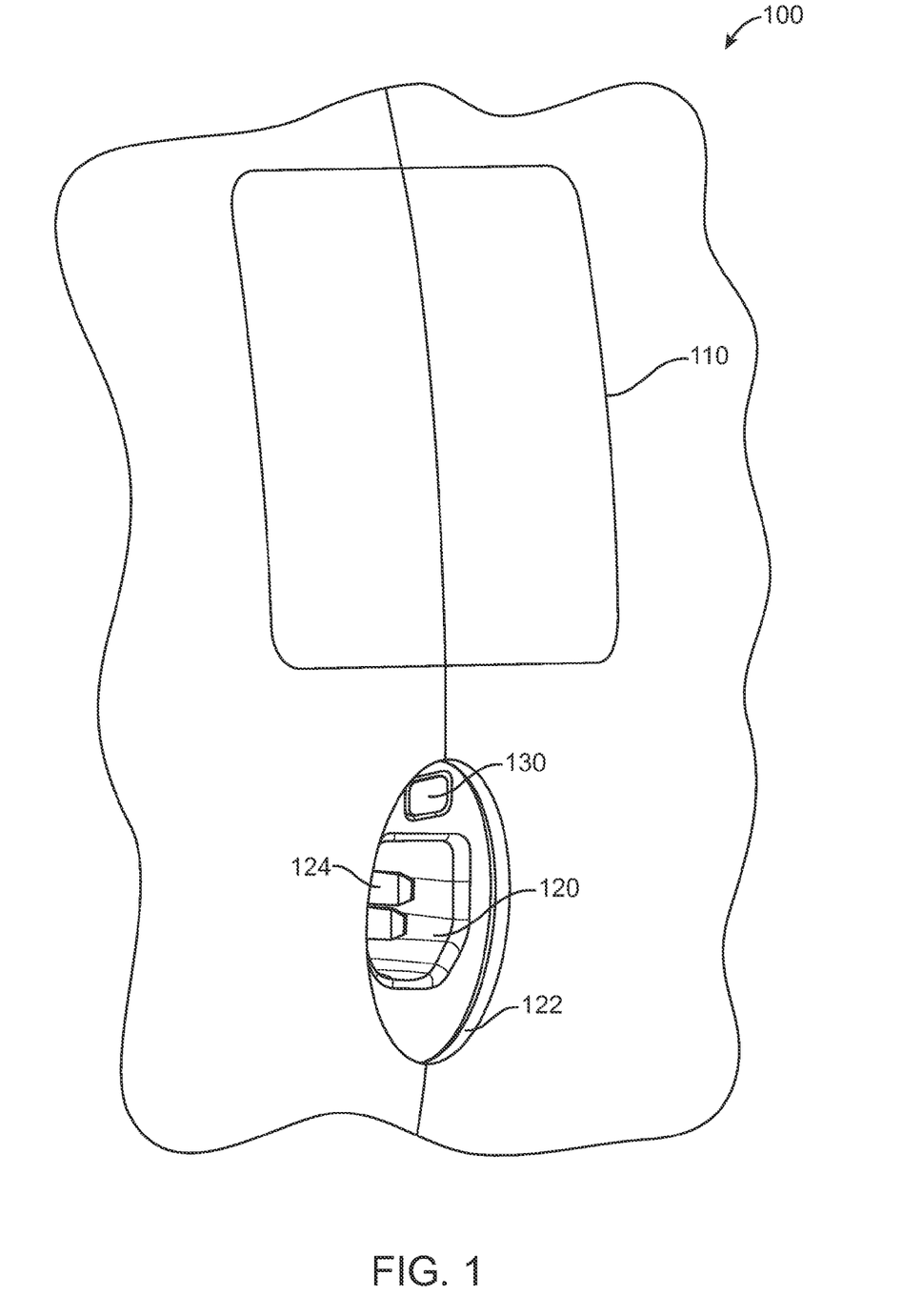
FIG. 1 illustrates a portion of a device enclosure according to an embodiment of the present invention.

FIG. 1 illustrates a portion of a device enclosure according to an embodiment of the present invention. This figure, as with the other included figures, is shown for illustrative purposes and does not limit either the possible embodiments of the present invention or the pending claims.

This figure illustrates device enclosure portion 100 having a door or other cover mechanism 110 and receptacle 120. Door 110 may be a cover, door, or other covering mechanism or structure. Door 110 may be opened or removed to allow access to sockets and electrical components located in the electronic device. These sockets and electrical components may include memory cards, graphics cards, wireless networking cards, solid-state memories, sockets for these circuits, or other components. Door 110 may open by swinging open, sliding open, or it may open in other ways.

Receptacle 120 may be a power receptacle arranged to accept a power cord. Receptacle 120 may be another type of receptacle arranged to receive power, such as a receptacle to receive power and data. In other embodiments of the present invention, receptacle 120 may be other still another type of receptacle. In this example, receptacle 120 may include prongs 144 for receiving power from a power plug. Receptacle 120 may have a rounded opening 122 to accept a conforming power plug, though in other embodiments of the present invention, receptacle 120 may have other shaped openings.

Receptacle 120 may further include button 130. Button 130 may be depressed by a user. When button 130 is released by a user, button 130 may return to a normal or up position. In other embodiments of the present invention, when button 130 is released and door 110 is closed or replaced, the closing or replacing action may drive button 130 back to the normal position. When button 130 is depressed, a locking mechanism (not shown) may allow door 110 to be opened. For example, the locking mechanism may eject or push door 110 open. When button 130 is in the normal position, a locking mechanism may lock door 110 such that it remains closed. In other embodiments of the present invention, the locking mechanism may simply not eject or open door 110.

When a power plug is inserted into receptacle 120, button 130 may not be at accessible to a user. That is, button 130 may be covered by the power plug such that the button is below a part of the power plug. Button 130 may then be located between the power plug, or portion of the power plug, and receptacle 120. In this case, when door 110 is closed, and button 130 is not accessible, a locking mechanism may lock door 110 and may not allow door 110 to be opened or removed, though other embodiments may simply not eject or open door 110. This may prevent a user from accessing components below door 110 when power is being applied to the electronic device. When the power plug is removed and power is thus removed from the electronic device, a user may access button 130. When a user depresses button 130, the locking mechanism may allow door 110 to be opened or removed, or it may eject or open door 110. When door 110 is ejected, opened, or removed, a user may access components below door 110.

Figure 2:
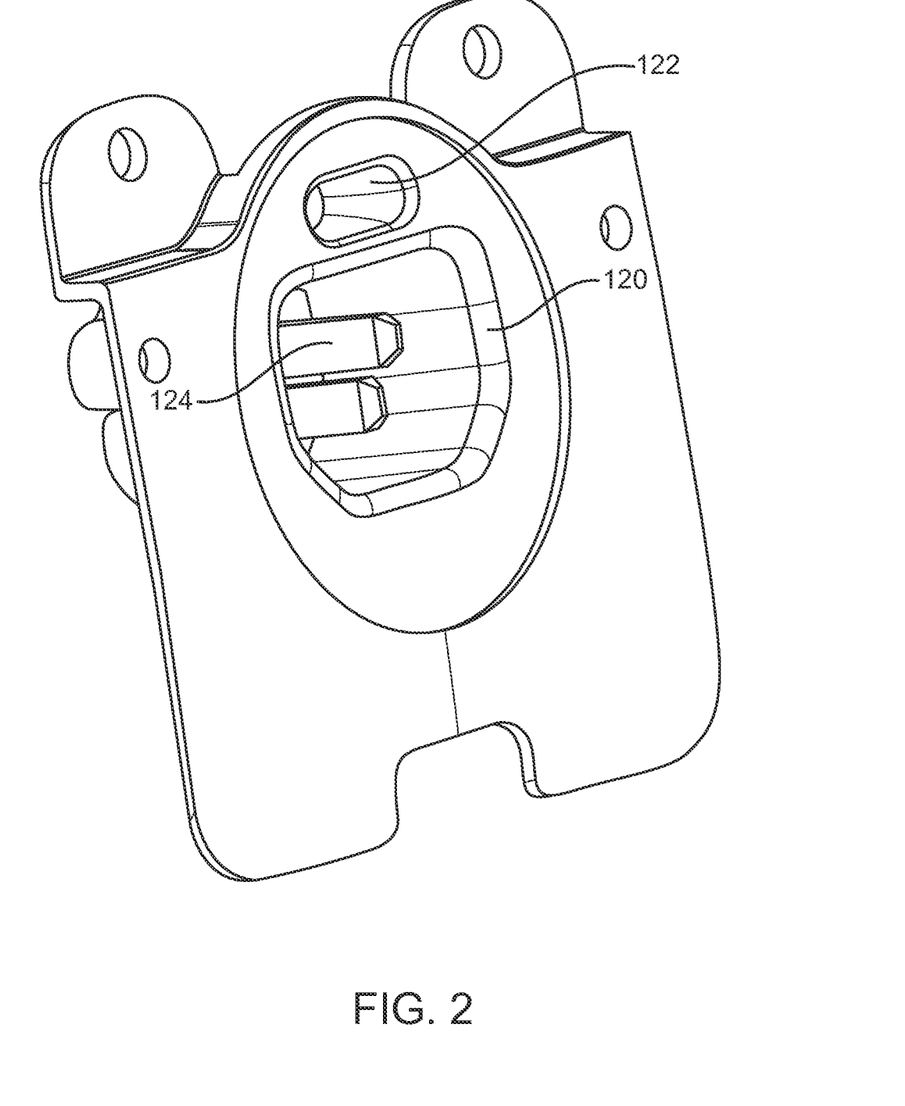
FIG. 2 illustrates a receptacle housing they may be used for a receptacle according to an embodiment of the present invention.

FIG. 2 illustrates a receptacle housing that may be used for a receptacle according to an embodiment of the present invention. This receptacle housing may be used for receptacle 120. Receptacle 120 may include an opening 122 for a button and prongs 124 for receiving power.

Figure 3:
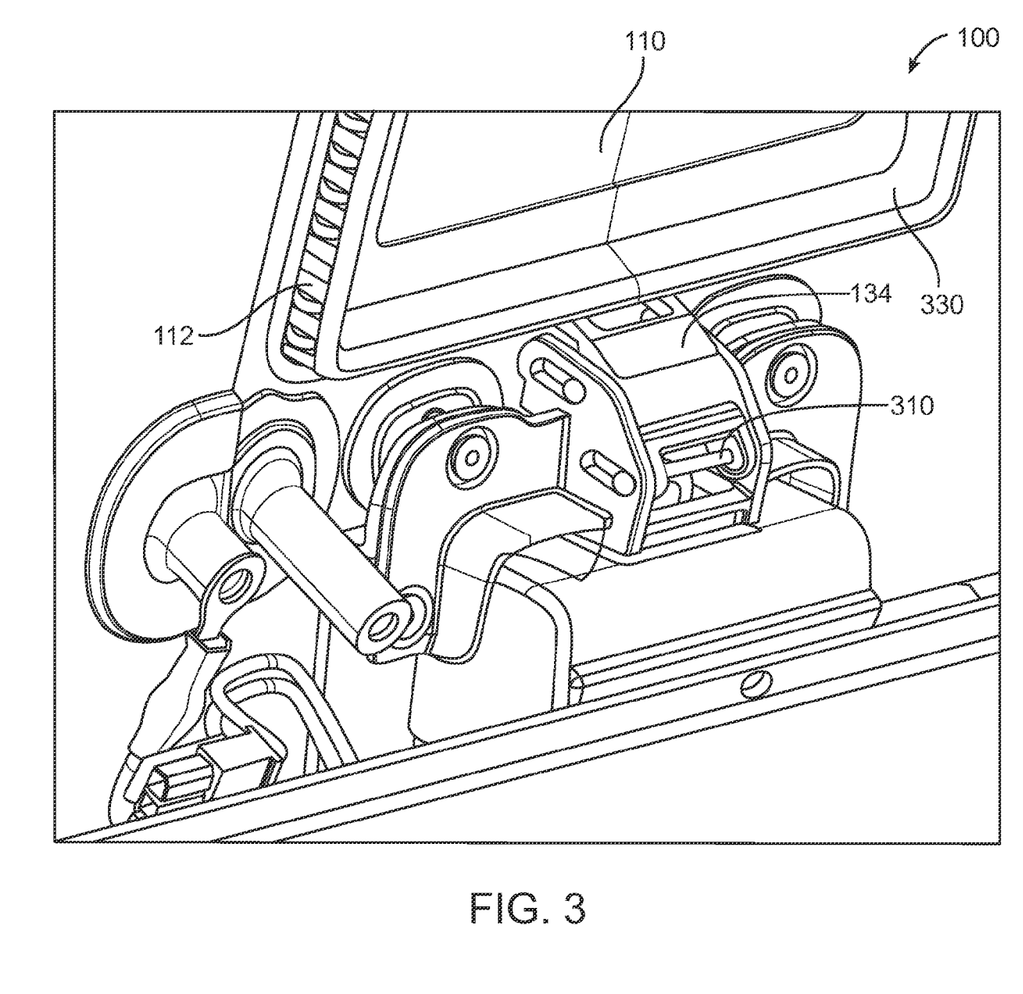
FIG. 3 illustrates a view of a portion of a device enclosure from inside the device according to an embodiment of the present invention.

FIG. 3 illustrates a view of a portion of a device enclosure from inside the device according to an embodiment of the present invention. Door 110 may be supported by frame 330. As button 130 is depressed, rotating hinges 310 and 134 may slide a bolt of opening mechanism (not shown) outward such that door 110 may be opened or removed. Clips 112 may be located around door 110 to form a solid mechanical seal.

In various embodiments of the present invention, various locking mechanisms may be used. One example is shown in the following figures.

Figure 4:
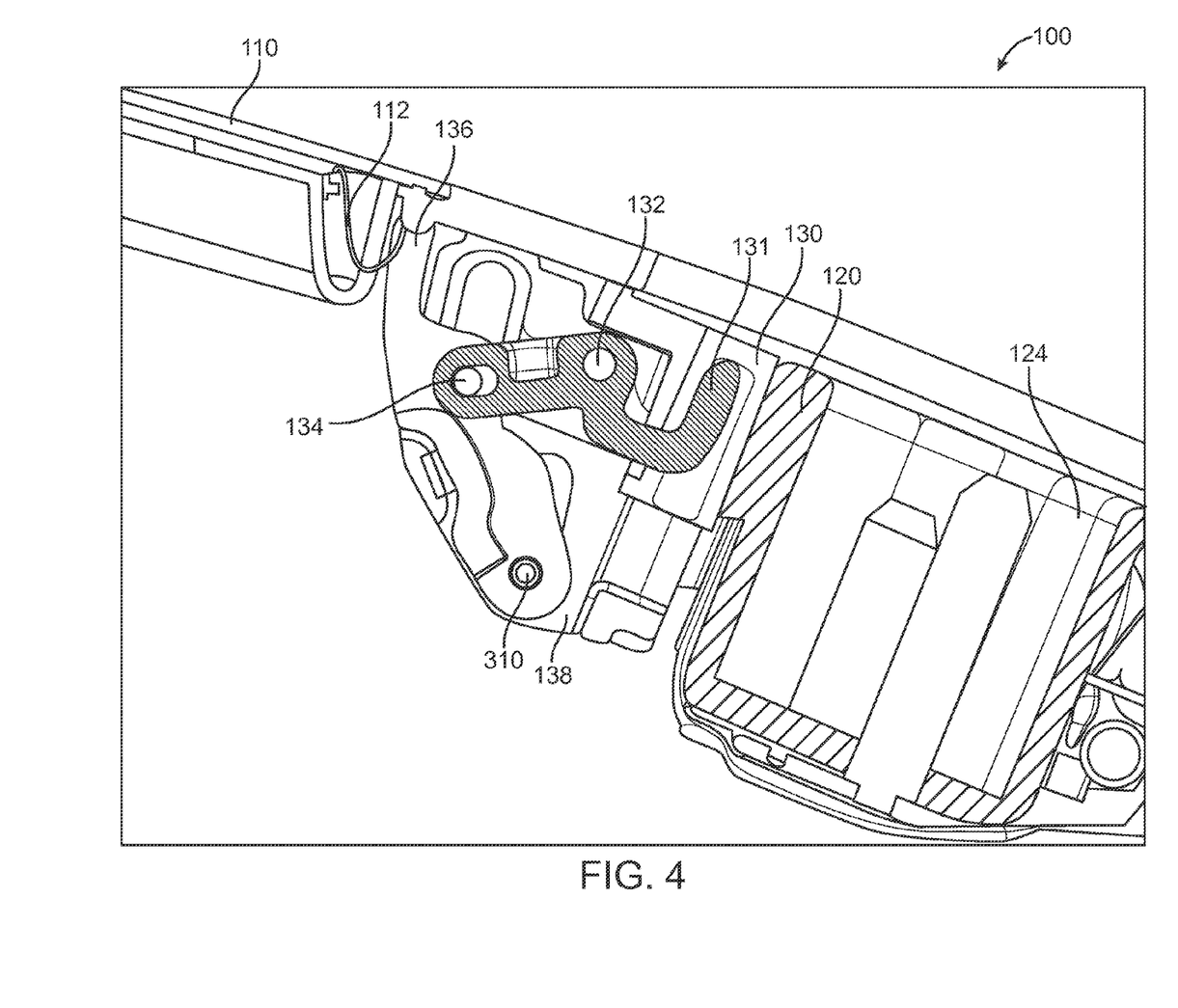
FIG. 4 illustrates a side view of a portion of a device enclosure according to an embodiment of the present invention.

FIG. 4 illustrates a side view of a portion of a device enclosure according to an embodiment of the present invention. In this example, door 110 may be closed, and button 130 may be in a normal state. Device enclosure portion 100 may include receptacle 120 and door 110. Receptacle 120 may include prongs 124 to receive power, for example from a wall outlet, power adapter, or other power source. Receptacle 120 may further include button 130. Button 130 may be in contact with pivoting arm 131. Printing arm 131 may pivot about pivot point 132. A distant arm of pivoting arm 131 may be connected to opening mechanism 136 at point 134.

As button 130 is depressed, pivoting arm 131 may rotate clockwise about point 132. Point 132 may be driven upward by this movement, thereby pushing opening mechanism 136 into door 110. This action may push the door 110 open. Clips 112 may be included to hold door 110 in place until opened by opening mechanism 136. Clips 112 may surround door 110 to provide a solid mechanical seal.

Figure 5:
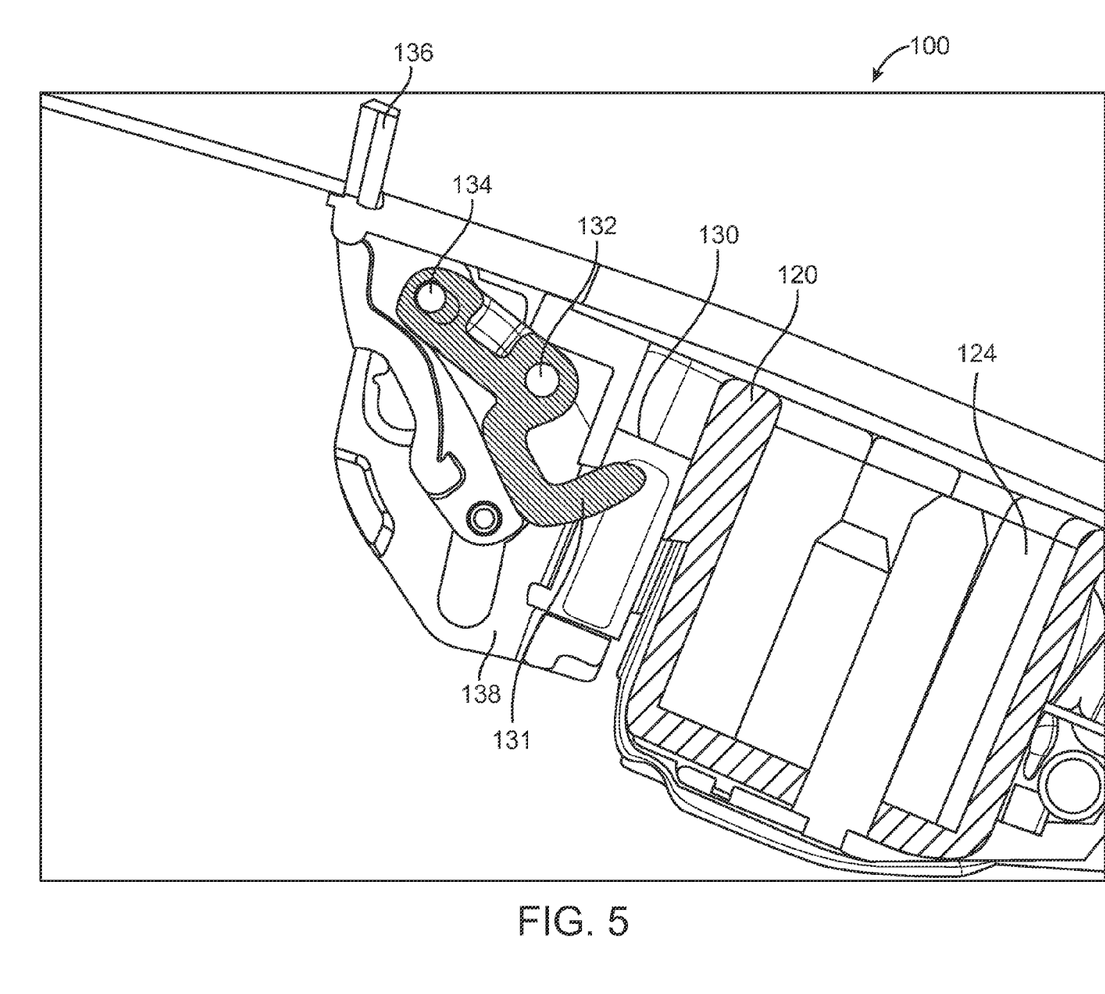
FIG. 5 illustrates another side view of a portion of a device enclosure according to an embodiment of the present invention.

FIG. 5 illustrates another side view of a portion of a device enclosure according to an embodiment of the present invention. In this example, door 110 has been opened by opening mechanism 136. Specifically, button 130 has been depressed, and pivoting arm 131 has rotated about pivot point 132. This in turn has forced point 134 upwards. Point 134 in turn may drive opening mechanism 136 into door 110, which thereby may release or open door 110. Bracket 138 may provide a support structure for button 130, pivoting arm 131, and opening mechanism 136.

When door 110 is replaced, opening mechanism 136 may be lowered, thereby dropping point 134 downward and turning pivoting arm 131 in a counterclockwise direction. This may raise button 130 back to the normal or non-depressed position.

Figure 6:
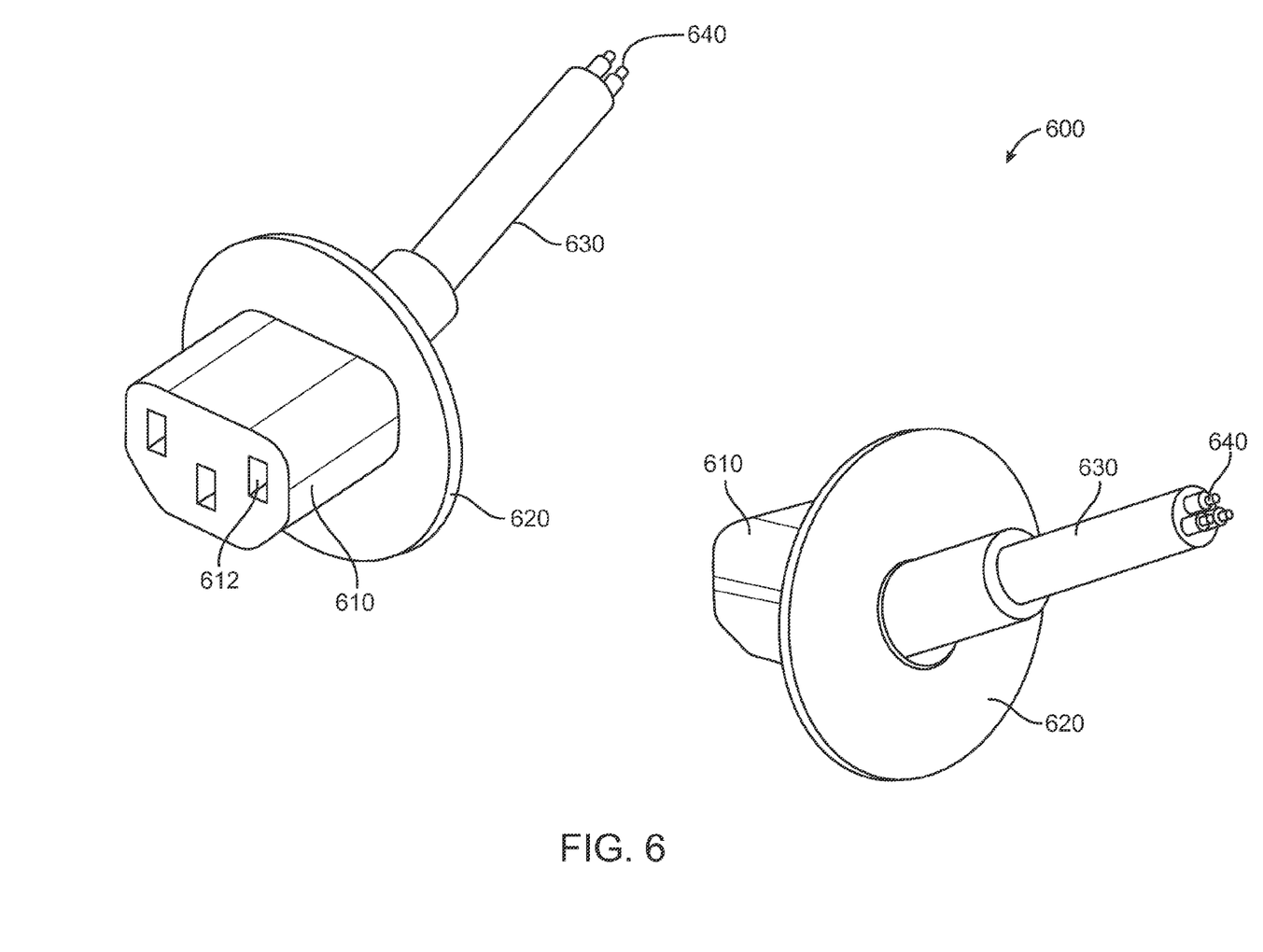
FIG. 6 illustrates a power plug according to an embodiment of the present invention.

FIG. 6 illustrates a power plug according to an embodiment of the present invention. Power plug 600 may include nose 610 for insertion into socket 120. Openings 612 may accept prongs 124 in receptacle 120. Openings 612 may contain contacts that are connected to conductors 640 in power cable 630. Flange 620 may be sized to mate with, or fit into, opening 122, as shown in FIG. 1. In this way, when power plug 600 is inserted into receptacle 120, flange 620 may cover button 130. This in turn may render button 130 inaccessible to a user when power is applied to the electronic device. Since button 130 cannot be depressed when plug 600 is inserted into receptacle 120, door 110 may not be opened or removed when power is applied to the electronic device. This may in turn protect a user from voltages that may be encountered inside the electronic device when power is applied. This may also protect the internal circuits. When power plug 600 is removed, power may be removed from the device, button 130 may be depressed, and door 110 may be opened or removed.

In other embodiments of the present invention, other features may be included. For example, it may be desirable to prevent power from being applied at receptacle 120 until door 110 is closed. This may be accomplished by having button 130 or another mechanism rise from receptacle 120 when door 110 is open to prevent insertion of a power plug into receptacle 120.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An electronic device comprising: a receptacle to receive an external electrical connection, the receptacle including a button, the button having a depressed state and a normal state; a covering mechanism to cover one or more electrical components in the electronic device, the covering mechanism having an open state and a closed state; and a locking mechanism having a locked state when the button is in the normal state and an open state when the button is in the depressed state, wherein the receptacle is a power receptacle, wherein the covering mechanism is a door, and when the door is in the closed state and the button is in the normal state, the locking mechanism does not open the door, wherein when the door is in the closed state and the button is in the depressed state, the locking mechanism pushes the door into the opened state, and wherein when a power plug is inserted in the power receptacle, the button is not accessible.

2. The electronic device of claim 1 wherein the electronic device is an all-in-one computer.

3. The electronic device of claim 1 wherein when the door is opened, the door may be removed.

4. The electronic device of claim 1 wherein the receptacle further comprises prongs for receiving power.

5. The electronic device of claim 1 wherein the door covers a socket for a plurality of memory cards.

6. An electronic device comprising: a receptacle to receive an external electrical connection, the receptacle including a button, the button having a depressed state and a normal state; a covering mechanism to cover one or more electrical components in the electronic device, the covering mechanism having an open state and a closed state; and a locking mechanism having a locked state when the button is in the normal state and an open state when the button is in the depressed state, wherein the covering mechanism is a door, and when the door is in the closed state and the button is in the normal state, the locking mechanism does not open the door, wherein when the door is in the closed state and the button is in the depressed state, the locking mechanism pushes the door into the opened state, wherein the receptacle is a power receptacle; and wherein when a power plug is inserted in the power receptacle, the button is located between the receptacle and the power plug.

7. The electronic device of claim 6 wherein when the door is opened, the door may be removed.

8. The electronic device of claim 6 wherein the door covers a socket for a plurality of memory cards.

9. An electronic device comprising:
a receptacle to receive an external electrical connection, the receptacle including a button, the button having a depressed state and a normal state;
a covering mechanism to cover one or more electrical components in the electronic device, the covering mechanism having an open state and a closed state; and
a locking mechanism having a locked state when the button is in the normal state and an open state when the button is in the depressed state,
wherein the receptacle is a power receptacle
wherein when the covering mechanism is a door, and the door is in the closed state and the button is in the normal state, the locking mechanism does not open the door,
wherein when the door is in the closed state and the button is in the depressed state, the locking mechanism pushes the door into the opened state,
wherein the locking mechanism includes a rotating hinge to turn and drive an ejection mechanism when the button is depressed.

10. The electronic device of claim 9 wherein the door covers a socket for a plurality of memory cards.

11. The electronic device of claim 9 wherein when the door is opened, the door may be removed.

12. The electronic device of claim 9 wherein the electronic device is an all-in-one computer.

13. An enclosure for an electronic device, the enclosure comprising: a power receptacle to receive a power plug, the power receptacle including prongs for receiving power and a button, wherein the button may be depressed, and when the button is not depressed, the button returns to a normal state; a covering mechanism to cover a socket for one or more electronic components, the covering mechanism capable of being open or closed; and a locking mechanism to keep the covering mechanism closed when the button is in the normal state, wherein the covering mechanism is a door and when the door is closed and the button is depressed, the door may be opened, and wherein the locking mechanism includes a rotating hinge to turn and drive an eject mechanism to allow the door to open when the button is depressed.

14. The enclosure of claim 13 wherein when the door is opened, the door may be removed.

15. The enclosure of claim 13 wherein the socket for one or more electronic components is a socket for a plurality of memory cards.

16. An enclosure for an electronic device, the enclosure comprising: a power receptacle to receive a power plug, the power receptacle including prongs for receiving power and a button, wherein the button may be depressed, and when the button is not depressed, the button returns to a normal state; a covering mechanism to cover a socket for one or more electronic components, the covering mechanism capable of being open or closed; and a locking mechanism to keep the covering mechanism closed when the button is in the normal state, wherein the covering mechanism is a door and when the door is closed and the button is depressed, the door may be opened, and wherein when a power plug is inserted in the power receptacle, the button is not accessible.

17. The enclosure of claim 16 wherein when the door is opened, the door may be removed.

18. The enclosure of claim 16 wherein the socket for one or more electronic components is a socket for a plurality of memory cards.

19. The enclosure of claim 16 wherein the electronic device is an all-in-one computer.

20. An enclosure for an electronic device, the enclosure comprising: a power receptacle to receive a power plug, the power receptacle including prongs for receiving power and a button, wherein the button may be depressed, and when the button is not depressed, the button returns to a normal state; a covering mechanism to cover a socket for one or more electronic components, the covering mechanism capable of being open or closed; and a locking mechanism to keep the covering mechanism closed when the button is in the normal state, wherein the covering mechanism is a door and when the door is closed and the button is depressed, the door may be opened, and wherein when a power plug is inserted in the power receptacle, the power plug covers the button.

21. The enclosure of claim 20 wherein the power receptacle further comprises prongs for receiving power.

22. The enclosure of claim 20 wherein when the door is opened, the door may be removed.

23. The enclosure of claim 20 wherein the socket for one or more electronic components is a socket for a memory card.

24. The enclosure of claim 20 wherein the socket for one or more electronic components is an SO-DIMM socket.

\* \* \* \* \*